US006759924B2

(12) United States Patent
Sakuragawa et al.

(10) Patent No.: US 6,759,924 B2
(45) Date of Patent: Jul. 6, 2004

(54) MULTI-FREQUENCY ANTENNA DUPLEXER

(75) Inventors: Toru Sakuragawa, Osaka (JP); Yuki Satoh, Osaka (JP); Kozo Murakami, Osaka (JP); Ryoichi Takayama, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 54 days.

(21) Appl. No.: 10/049,257
(22) PCT Filed: Jun. 7, 2001
(86) PCT No.: PCT/JP01/04820
§ 371 (c)(1),
(2), (4) Date: Jun. 14, 2002
(87) PCT Pub. No.: WO01/95487
PCT Pub. Date: Dec. 13, 2001

(65) Prior Publication Data
US 2002/0186097 A1 Dec. 12, 2002

(30) Foreign Application Priority Data
Jun. 8, 2000 (JP) ........................................ 2000-171538

(51) Int. Cl.⁷ ............................................... H01L 41/00
(52) U.S. Cl. ....................................... 333/133; 333/187
(58) Field of Search ................................. 333/133, 187, 333/191, 193, 194, 195, 196, 188, 186

(56) References Cited

U.S. PATENT DOCUMENTS

| 5,815,804 | A | | 9/1998 | Newell et al. | |
|---|---|---|---|---|---|
| 6,380,823 | B1 | * | 4/2002 | Ikata et al. | 333/133 |
| 6,424,238 | B1 | * | 7/2002 | Penunuri | 333/187 |

FOREIGN PATENT DOCUMENTS

JP   2000349586   12/2000

* cited by examiner

Primary Examiner—Brian Young
Assistant Examiner—Joseph Lauture
(74) Attorney, Agent, or Firm—RatnerPrestia

(57) ABSTRACT

A small-sized multi-frequency antenna duplexer using surface acoustic wave filters to be applicable to a plurality of frequencies. This antenna duplexer includes two surface acoustic wave (SAW) filters for transmission and reception having passing bands of mutually different frequencies, a phase shift substrate, and a package for accommodating them. The passing band of each antenna duplexer is mutually different from other's passing band. This multi-frequency antenna duplexer includes a plurality of antenna duplexers. In one package, transmitter surface acoustic wave filters, receiver surface acoustic filters, and phase shift substrates are mounted. Thus, the multi-frequency antenna duplexer are reduced in size.

13 Claims, 8 Drawing Sheets

MULTI-FREQUENCY ANTENNA DUPLEXER

This application is a U.S. National Phase Application of PCT International Application PCT/JP01/04820 filed Jun. 7, 2001.

TECHNICAL FIELD

The present invention relates to an antenna duplexer used in mobile communication appliances, and more particularly to a multi-frequency antenna duplexer.

BACKGROUND ART

A conventional antenna duplexer is generally formed of coaxial resonators or distributed constant type resonators, and the number of stages of resonators and their shape are determined in order to obtain desired electric characteristics such as passing band width and attenuation amount.

A conventional multi-frequency antenna duplexer includes, as shown in FIG. 13, plural antenna duplexers, that is, transmitter filters 25a, 25b and receiver filters 26a, 26b respectivelly formed of coaxial resonators on a substrate 24. A switchable time division multiple access (TDMA) system contains, as shown in FIG. 14, a branching filter 23 for branching the passing frequency, and single pole double throw (SPDT) switches 27a, 27b for changing over transmission and reception. The SPDT switches 27a, 27b respectively change over transmitter terminals 16c, 16d, and receiver terminals 17c, 17d.

In this multi-frequency antenna duplexer, it is hard to reduce in size because the filter characteristic depends largely on the shape of resonators. In particular, a non-switchable code division multiple access (CDMA) system requires multiple resonators, and is increased in size. For example, when an multi-frequency antenna duplexer largely different in passing band frequency such as 800 MHz and 1.8 GHz is composed of distributed constant type resonators, the electric characteristic of substrate materials used in the distributed constant type resonators depends on the frequency. Therefore, it is hard to optimize the electric characteristic of substrate materials.

SUMMARY OF THE INVENTION

A small-sized multi-frequency antenna duplexer is presented. The antenna duplexer uses plural antenna duplexers, each of which includes two surface acoustic wave filters each for transmitter and receiver having passing bands different in frequency from each other, attenuating other's passing band each other. This multi-frequency antenna duplexer contains plural antenna duplexers mounted in one package. Further the passing band of each antenna duplexer is different from those of other antennas.

Thus, the multi-frequency antenna duplexer is reduced in size.

In this multi-frequency antenna duplexer, a first piezoelectric substrate on which plural transmitter surface acoustic wave filters are formed, a second piezoelectric substrate on which plural receiver surface acoustic wave filters are formed, and a phase shift substrate having a function of rotating the phase of each transmission band at least in each receiver surface acoustic wave filter are mounted in one package. Thus, the multi-frequency antenna duplexer suppresses signal leak between transmission and reception portions, and is reduced in size while maintaining isolation.

Further, in this multi-frequency antenna duplexer, transmitter surface acoustic wave filters and receiver surface acoustic wave filters, which constitute the antenna duplexer having passing bands different in frequency, are formed individually on one piezoelectric substrate. Further in each receiver surface acoustic wave filter, phase shift substrate having a function of rotating the phase of each transmission band are configured and mounted in a three-dimensional structure in one package. Thus, in this multi-frequency antenna duplexer, plural antenna duplexers, having passing bands largely different in frequency from each other, can be reduced in size without deteriorating the characteristics.

Herein, in the multi-frequency antenna duplexer, as for the antenna duplexer for two frequencies corresponding to two passing band frequencies, only one antenna output terminal may be required by connecting a branching filter installed in the one package as the antenna duplexer to the antenna terminal of each antenna duplexer. As a result, a small-sized multi-frequency antenna duplexer may be obtained.

Further, by forming the phase shift substrate and branching filter used in the multi-frequency antenna duplexer in the package inner layer, an multi-frequency antenna duplexer of further smaller size is obtained.

Moreover, in the multi-frequency antenna duplexer, by using the surface acoustic wave filters and bulk wave filters selectively depending on the passing band frequency or desired filter characteristic, an antenna duplexer for plural frequency having a superior performance can be realized in a smaller size.

BEST MODE FOR CARRYING OUT THE INVENTION

Figure 1:
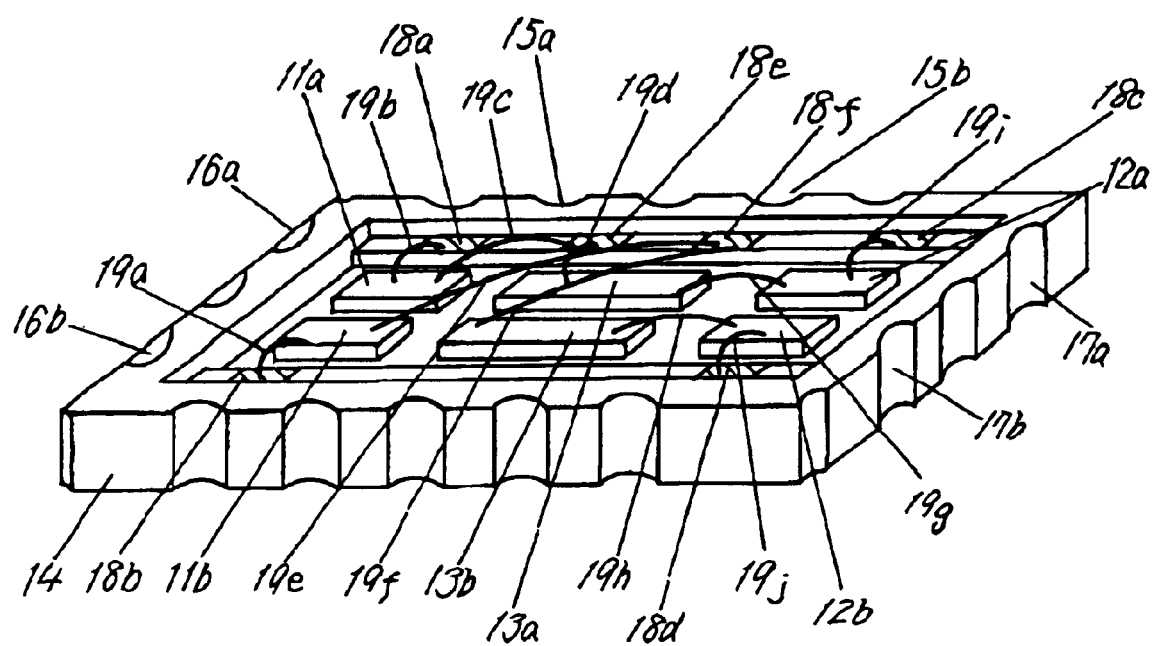
FIG. 1 is a perspective view of an multi-frequency antenna duplexer according to embodiment 1 of the invention.

Preferred embodiments of the invention are described below while referring to FIG. 1 to FIG. 12. In FIG. 1 to FIG. 12, the same elements are identified with the same reference numerals.

(Embodiment 1)

FIG. 1 is a perspective view of a multi-frequency antenna duplexer according to embodiment 1 of the invention. The multi-frequency antenna duplexer is formed of transmitter surface acoustic (SAW) filters 11a, 11b, receiver SAW filters 12a, 12b, phase shift substrates 13a, 13b, and a package 14 formed on a piezoelectric substrate. The phase shift substrate rotates the phase of the input signal.

Herein, the phase shift substrate specifically rotates the phase of the receiver SAW filters 12a, 12b in the transmission frequency band of this antenna duplexer, and reduces the insertion loss in the passing frequency band of the transmitter SAW filters. In other words, the phase shift substrate suppresses leak of signal between the transmission side and reception side, and maintains the isolation between the two.

Outside of the package 14, there are antenna terminals 15a, 15b, transmitter terminals 16a, 16b, receiver terminals 17a, 17b, and grounding terminal (not shown), and connection pads 18a to 18f are provided inside. Inside the package 14, the connection pads 18a, 18b are connected to transmitter terminals 16a, 16b, the connection pads 18c, 18d to the receiver terminals 17a, 17b, and the connection pads 18e, 18f to the antenna terminals 15a, 15b, respectively.

The transmitter SAW filters 11a, 11b, receiver SAW filters 12a, 12b, and phase shift substrates 13a, 13b respectively have two connection terminals each. One terminal of the transmitter SAW filter 11a and connection pad 18a are connected by a bonding wire 19b, and one terminal of the transmitter SAW filter 11b and connection pad 18b are connected by a bonding wire 19a. Another terminal of the transmitter SAW filter 11a and connection pad 18e are connected by a bonding wire 19c. Another terminal of the transmitter SAW filter 11b and connection pad 18f are connected by a bonding wire 19e. One terminal of the receiver SAW filter 12a and connection pad 18c are connected by a bonding wire 19i, and one terminal of the receiver SAW filter 12b and connection pad 18d are connected by a bonding wire 19j. Another terminal of the receiver SAW filter 12a and one terminal of the phase shift substrate 13a are connected by a bonding wire 19g. Another terminal of the receiver SAW filter 12b and one terminal of the phase shift substrate 13b are connected by a bonding wire 19h. Another terminal of the phase shift substrate 13a and connection pad 18e are connected by a bonding wire 19d. Another terminal of the phase shift substrate 13b and connection pad 18f are connected by a bonding wire 19f.

Figure 2:
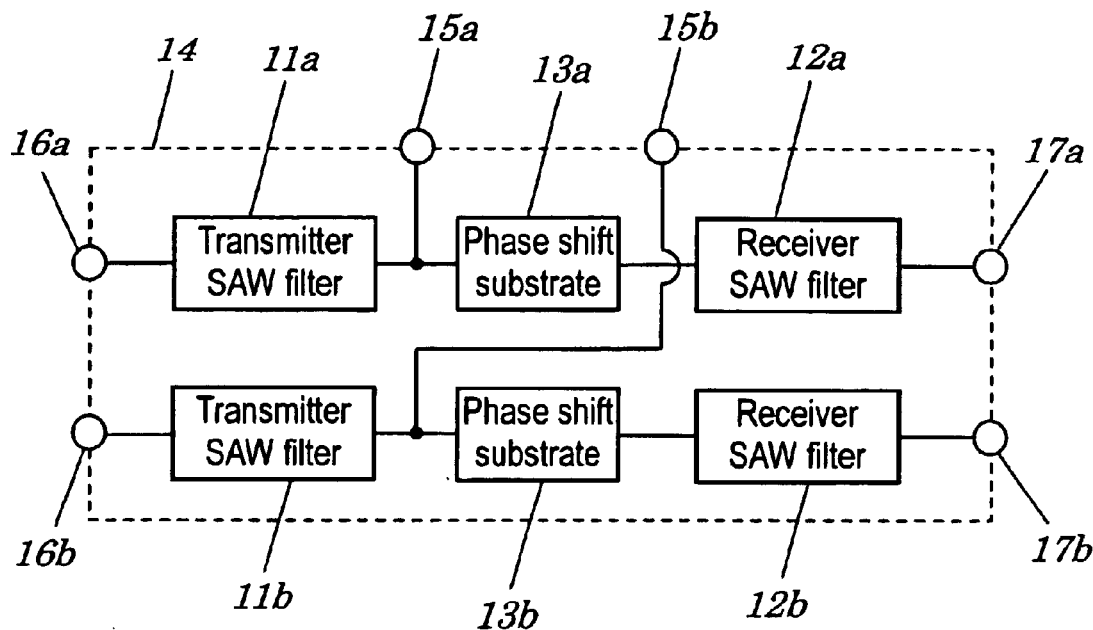
FIG. 2 is a circuit diagram of the multi-frequency antenna duplexer according to embodiment 1.

FIG. 2 is a circuit diagram of the multi-frequency antenna duplexer in FIG. 1.

Figure 3:
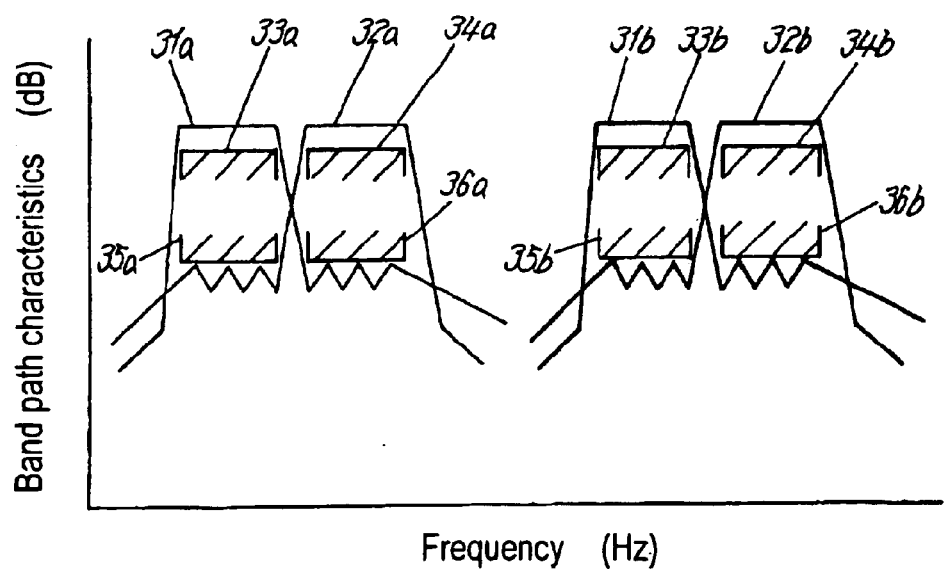
FIG. 3 shows the frequency characteristics of the multi-frequency antenna duplexer according to embodiment 1.

FIG. 3 shows the frequency characteristics of the multi-frequency antenna duplexer in FIG. 1. The antenna duplexer including transmitter SAW filter 11a, receiver SAW filter 12a, and phase shift substrate 13a respectively has passing characteristics 31a, 32a having passing bands 33a, 34a and attenuating bands 35a, 36a. In other words, the transmitter filter and receiver filter mutually have attenuating characteristics in other's passing band. The antenna duplexer including transmitter SAW filter 11b, receiver SAW filter 12b, and phase shift substrate 13b has passing characteristics 31b, 32b respectively having passing bands 33b, 34b and attenuating bands 35b, 36b respectively.

According to this configuration, since the transmitter SAW filters 11a, 11b, receiver SAW filters 12a, 12b, and phase shift substrates 13a, 13b can be mounted in one package 14, a small-sized multi-frequency antenna duplexer can be obtained.

Figure 4:
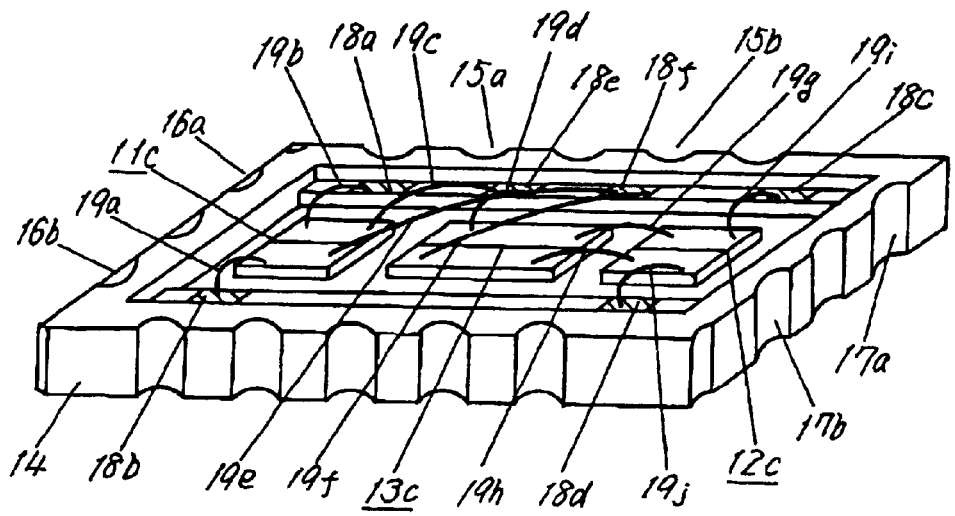
FIG. 4 is a perspective view of another multi-frequency antenna duplexer according to embodiment 1.

FIG. 4 is a perspective view of another multi-frequency antenna duplexer according to embodiment 1. When passing frequency bands of plural antenna duplexers are close to each other, the antenna duplexer is realized as shown in FIG. 4, by containing a transmitter SAW filter 11c having transmitter SAW filters 11a, 11b formed on one piezoelectric substrate, a receiver SAW filter 12c having receiver SAW filters 12a, 12b formed on the one piezoelectric substrate, and a phase shift substrate 13c on which plural phase shift circuits 13a, 13b are formed. This antenna duplexer saves the mounting area in the package, and a further smaller antenna duplexer is obtained. The thickness of the metal thin film on the piezoelectric substrate on which the SAW filter is formed preferably to be about 8 to 10% of the wavelength of the passing frequency obtained from the sonic velocity of the piezoelectric substrate.

Herein, since the passing frequency bands of the plural antenna duplexers are close to each other, plural SAW filters can be fabricated in one process on the piezoelectric substrate.

Figure 5:
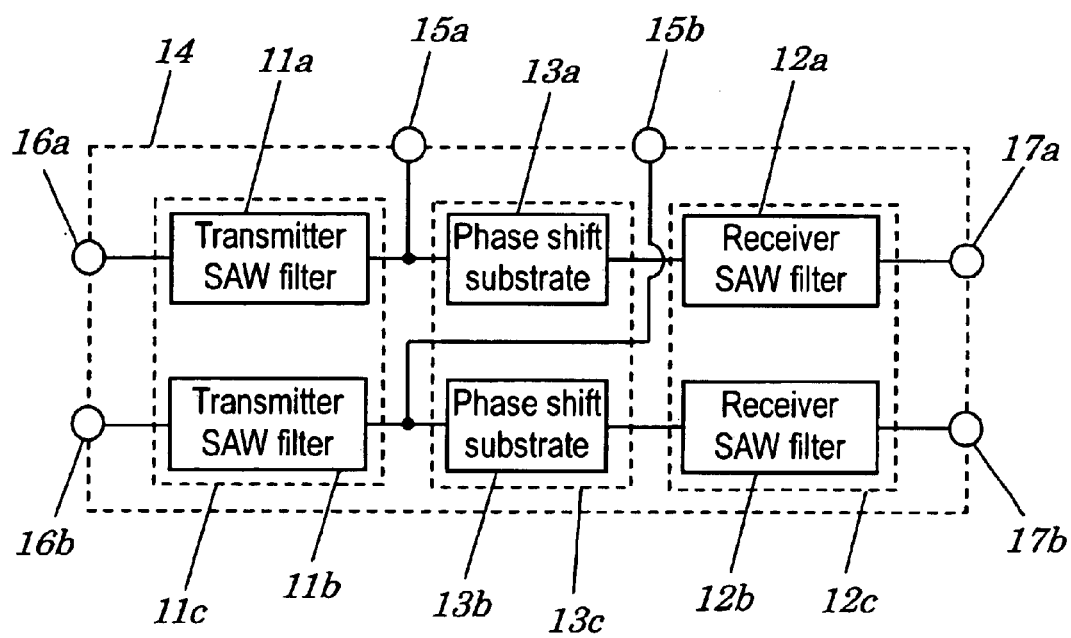
FIG. 5 is a circuit diagram of the another multi-frequency antenna duplexer according to embodiment 1.
Figure 6:
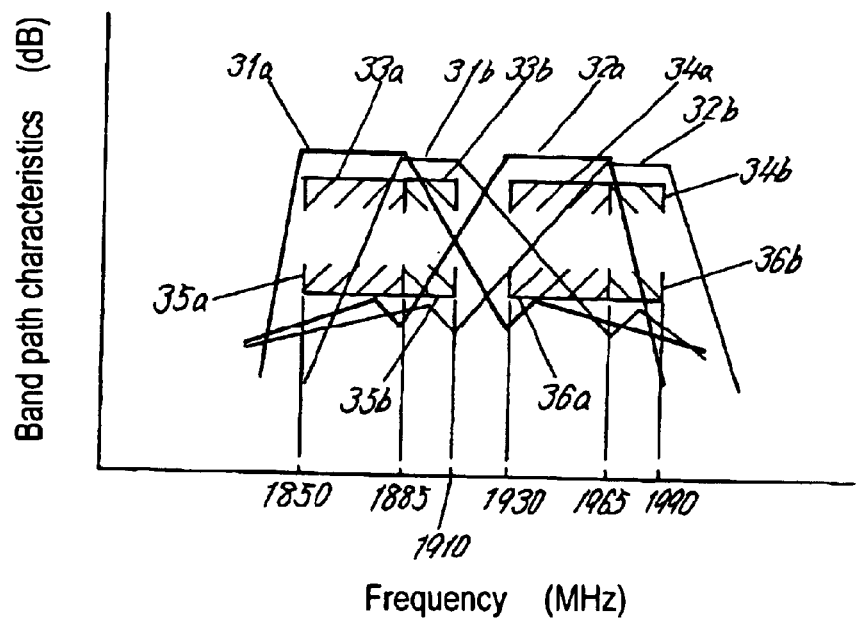
FIG. 6 shows the frequency characteristics of the another multi-frequency antenna duplexer according to embodiment 1.

FIG. 5 is a circuit diagram of another multi-frequency antenna duplexer in FIG. 4. FIG. 6 shows the characteristics of the multi-frequency antenna duplexer in FIG. 4 applied in a portable telephone system.

FIG. 6 shows the characteristics in the Personal Communication System (PCS) in the United States. The passing band 33a of the transmitter SAW filter is 1850 MHz to 1885 MHz. The passing band 33b of the transmitter SAW filter is 1885 MHz to 1910 MHz. The passing band 34a of the receiver SAW filter is 1930 MHz to 1965 MHz, and the passing band 34b of the receiver SAW filter is 1965 MHz to 1990 MHz.

Figure 7:
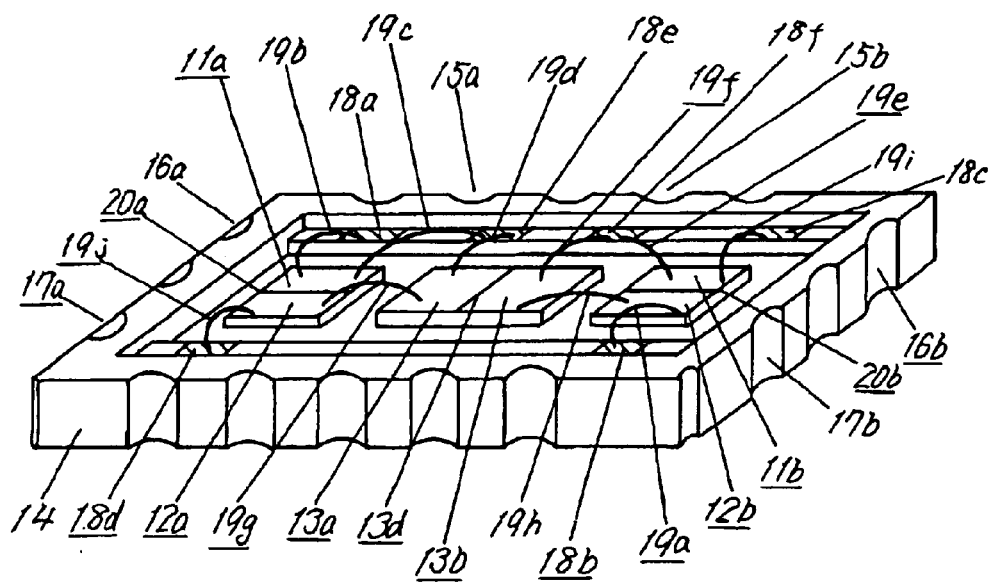
FIG. 7 is a perspective view of a different multi-frequency antenna duplexer according to embodiment 1.

FIG. 7 is a perspective view of a further multi-frequency antenna duplexer according to embodiment 1. Contrary to the case above, when the passing frequency bands of plural antenna duplexers are largely different, the optimum value of thickness of the metal thin film on the piezoelectric substrate is largely different between the plural antenna duplexers. Therefore, when these transmitter filters are formed on one piezoelectric substrate, or when the respective receiver filters formed on the one piezoelectric substrate, it is difficult to optimize the thickness of the metal thin film.

Accordingly, as shown in FIG. 7, the transmitter SAW filter 11a and receiver SAW filter 12a of the one antenna duplexer closer to each other in the service frequency band are formed on one piezoelectric substrate 20a, while the transmitter SAW filter 11b and receiver SAW filter 12b are formed on a piezoelectric substrate 20b. As a result, a small-sized antenna duplexer is obtained without deteriorating the characteristics. Thus, plural antenna duplexers having largely different passing band frequencies can be reduced in size without deteriorating the characteristics.

Figure 8:
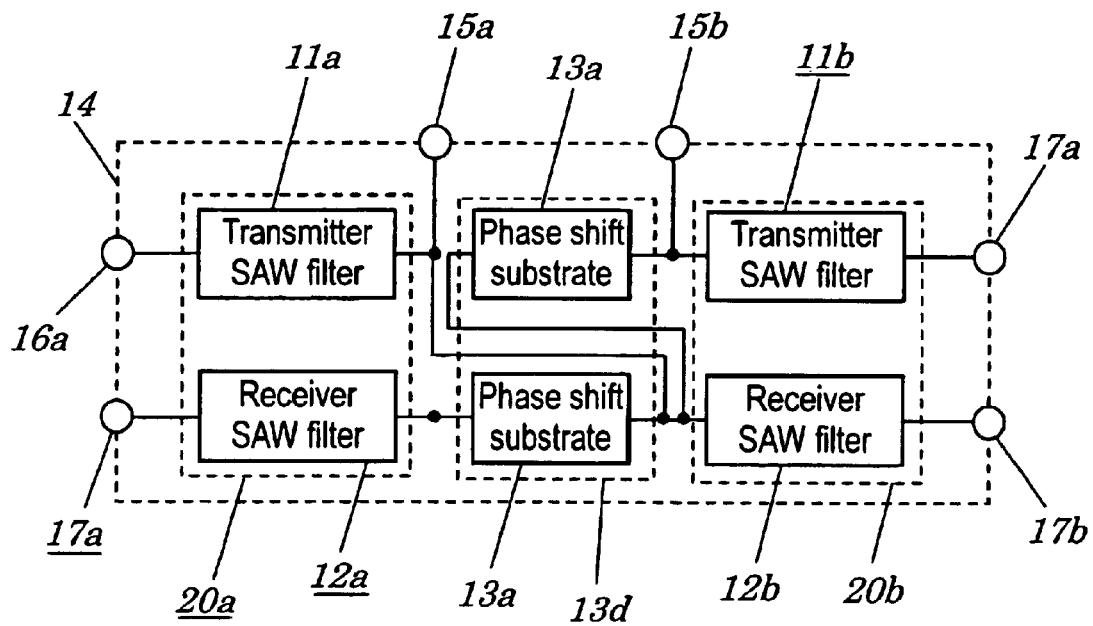
FIG. 8 is a circuit diagram of the different multi-frequency antenna duplexer according to embodiment 1.
Figure 9:
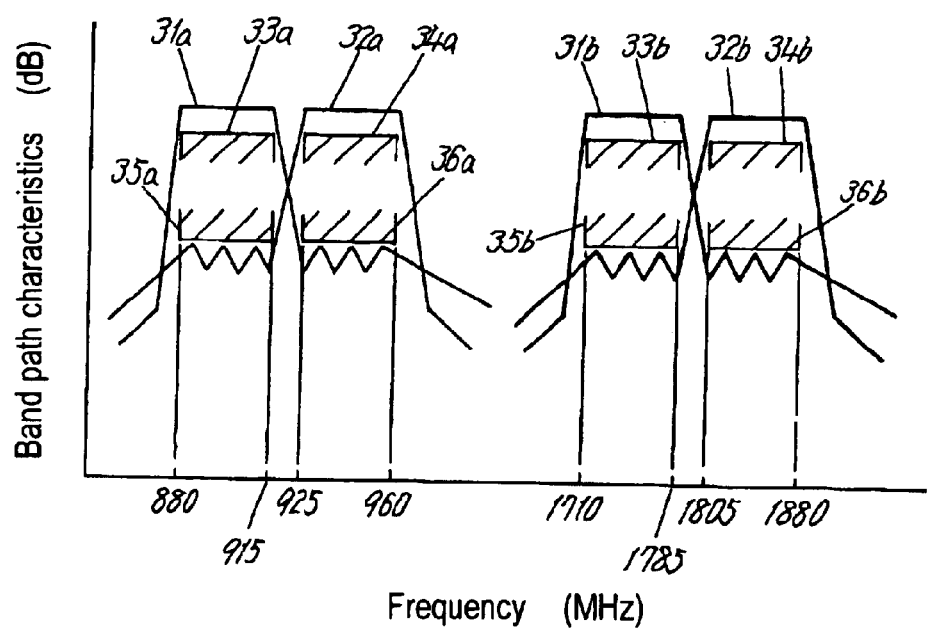
FIG. 9 shows the frequency characteristics of the different multi-frequency antenna duplexer according to embodiment 1.

FIG. 8 is a circuit diagram of the multi-frequency antenna duplexer in FIG. 7, and FIG. 9 shows the frequency characteristics of the multi-frequency antenna duplexer in FIG. 7 applied in a portable telephone system.

FIG. 9 shows the characteristics in the dual band system in the global system for mobile communications/digital cellular system (GSM/DCS) in Europe. The passing band 33a of the transmitter SAW filter is 880 MHz to 915 MHz, and the passing band 33b of the transmitter SAW filter is 1710 MHz to 1785 MHz. The passing band 34a of the receiver SAW filter is 925 MHz to 960 MHz, and the passing band 34b of the receiver SAW filter is 1805 MHz to 1880 MHz.

Figure 10:
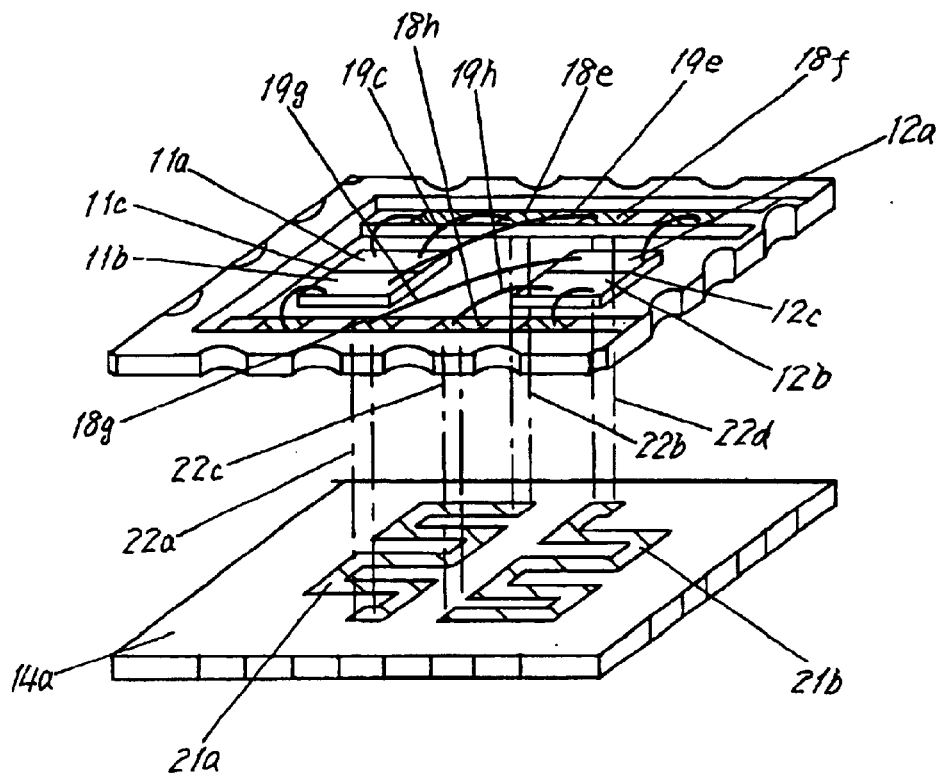
FIG. 10 is a perspective view of the multi-frequency antenna duplexer incorporating a phase shift substrate according to embodiment 1.

To realize a further smaller multi-frequency antenna duplexer, as shown in FIG. 10, phase shift substrates 13a, 13b may be installed in the inner layer of the package 14. One terminal of the receiver SAW filter 12a is connected to the connection pad 18g in the package 14 through wire bonding 19g, and one terminal of the receiver SAW filter 12b is connected to the connection pad 18h in the package 14 through wire bonding 19h. The connection pad 18g and one end of a phase shift line 21a are connected by way of a through hole 22a, and the connection pad 18h and one end of a phase shift line 21b are connected by way of a through hole 22c. The connection pad 18e and another end of the phase shift line 21a are connected by way of a through hole 22b, and the connection pad 18f and another end of the phase shift line 21b are connected by way of a through hole 22d.

This circuit is the same as the one shown in FIG. 5. Since the phase shift line is incorporated in the inner layer in the package, the mounting area of the phase shift substrate is curtailed, so that an multi-frequency antenna duplexer of further smaller size is realized.

In other words, the phase shift substrates, and transmitter and receiver SAW filters can be configured in a solid structure, so that a further reduction in size is realized.

In embodiment 1, an antenna duplexer for two frequencies different in passing band is explained. An antenna duplexer for three or more frequencies can be similarly mounted together in one package. When mounting the SAW filters and phase shift substrates in the package, instead of connecting them to the terminal of the package by wire bonding, by directly connecting them to the package with flip chips, a further smaller antenna duplexer is obtained.

(Embodiment 2)

Figure 11:
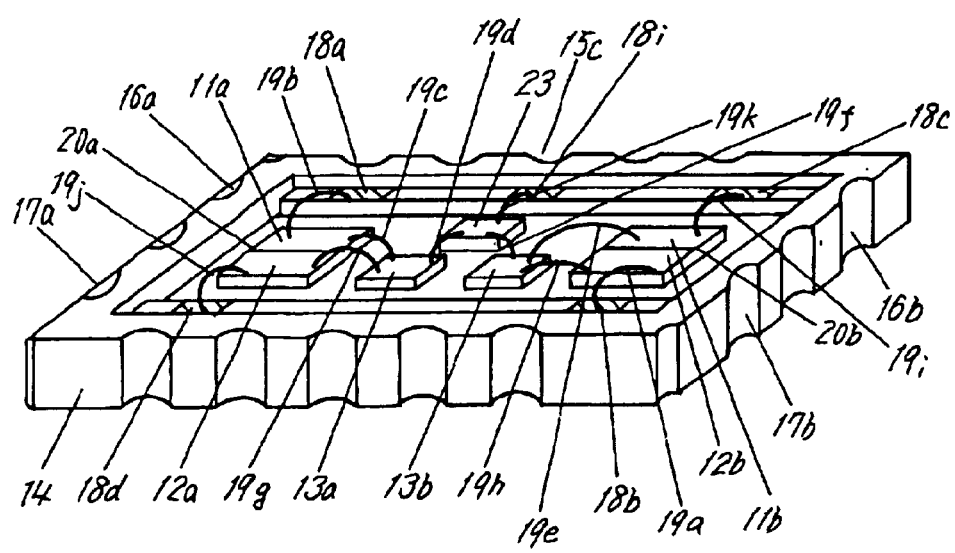
FIG. 11 is a perspective view of a multi-frequency antenna duplexer according to embodiment 2 of the invention.
Figure 12:
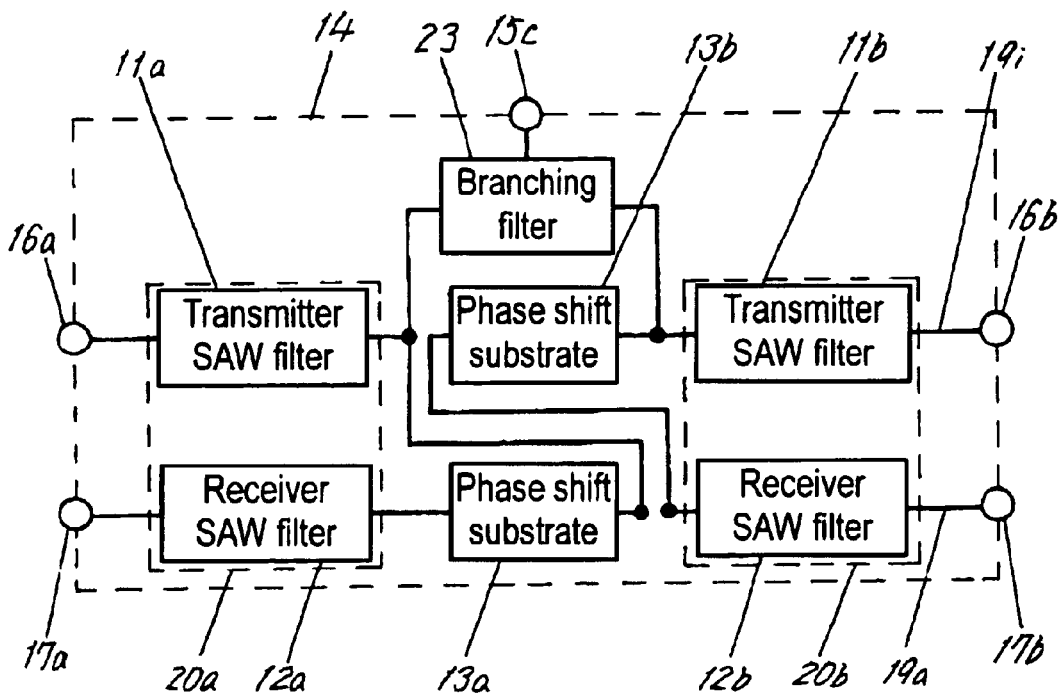
FIG. 12 is a circuit diagram of the multi-frequency antenna duplexer according to embodiment 2.
Figure 13:
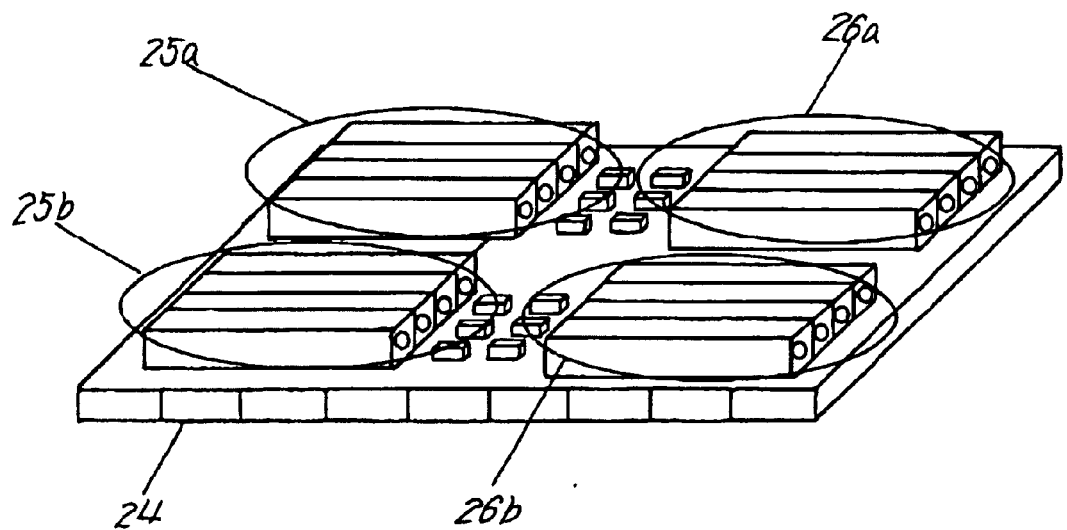
FIG. 13 is a perspective view of a multi-frequency antenna duplexer in a prior art.
Figure 14:
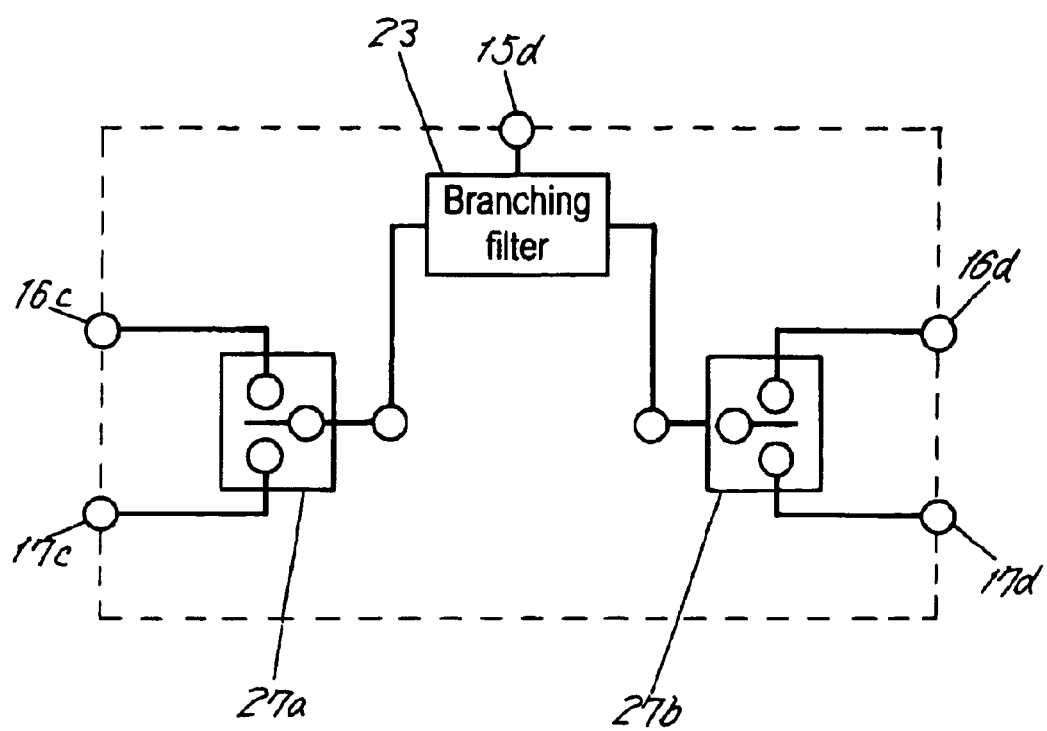
FIG. 14 is a circuit diagram of the multi-frequency antenna duplexer in the prior art.

FIG. 11 is a perspective view of a multi-frequency antenna duplexer according to embodiment 2 of the invention, and FIG. 12 is its circuit diagram.

In the multi-frequency antenna duplexer in FIG. 11, the same elements as shown in FIG. 7 explained in embodiment 1 shown in FIG. 7, and corresponding components are identified with the same reference numerals. A branching filter 23 is incorporated in the package 14.

As shown in FIG. 12, one terminal of the transmitter SAW filter 11a and one terminal of the branching filter 23 are connected to the phase shift substrate 13a in one antenna duplexer by way of wire bondings 19c, 19d, respectively. One terminal of the transmitter SAW filter 11b and another terminal of the branching filter 23 are connected to the phase shift substrate 13b in another antenna duplexer by way of wire bondings 19e, 19f, respectively.

This antenna duplexer is applicable to dual band system such as the global system for mobile communications/digital cellular system (GSM/DCS) explained in embodiment 1, while only one antenna terminal is needed. Therefore, the antenna duplexer is connected to the antenna without resort to any external elements. As a result, the device using it can be reduced in size.

Above is the explanation when the passing frequencies of plural antenna duplexers are largely different from each other as explained in FIG. 7 in embodiment 1. When the passing frequencies of plural antenna-duplexers are close to each other, a branching filter is inserted between terminals 15a and 15b in FIG. 4 in embodiment 1, so that only one antenna terminal is needed.

Or, when the branching filter 23 is installed in the inner layer in the package 14 like the phase shift lines 21a, 21b in FIG. 10 in embodiment 1, a further smaller antenna duplexer is obtained. Herein, the phase shift lines, branching filter, and transmitter and receiver SAW filters can be configured in a three-dimensional structure, so that a further reduction in size is realized.

In embodiments 1 and 2, when the passing band frequency is extremely low or depending on the desired filter characteristics, bulk wave filters may be used instead of the SAW filters. In the bulk wave filter, the piezoelectric substrate itself vibrates mechanically, thereby forming a resonator. Unlike the SAW filters, the bulk wave filters needs to be installed in a hollow structure of piezoelectric substrate. However, in the antenna duplexer of the invention, it is easily realized by changing the shape of the package. Thus, two types of filters can be used selectively depending on the passing band frequency and filter characteristics, so that the size can be reduced while maintaining the performance.

Industrial Applicability

According to the invention, as described herein, being formed of two SAW filters each for transmission and reception having passing bands different in frequency, a small-sized antenna duplexer for plural frequencies can be obtained by using a plurality of antenna duplexers for mutually attenuating the other's passing band each other.

In an antenna duplexer mounting two antenna duplexers and a branching filter in one package, the branching filter connects respective antenna terminals thereof. Thus, the antenna duplexer requires only one antenna output terminal. As a result, the multi-frequency antenna duplexer itself can be reduced in size. At the same time, it is not necessary to attach external element to the antenna terminal, and the device for using it is reduced in size.

Further, by incorporating the phase shift substrates and branching filter in the inner layer in the package, the mounting area of elements in the package is curtailed. Therefore, a smaller multi-frequency antenna duplexer is realized.

By using bulk wave filters in the transmitter and receiver filters depending on the passing band frequency or desired filter characteristic, a small-sized multi-frequency antenna duplexer of superior performance may be realized.

| Reference numerals in the drawings | |
|---|---|
| 11a, 11b, 11c | Transmitter surface acoustic wave filter |
| 12a, 12b, 12c | Receiver surface acoustic wave filter |
| 13a, 13b, 13c, 13d | Phase shift substrate |
| 14 | Package |
| 15a, 15b, 15c, 15d | Antenna terminal |
| 16a, 16b, 16c, 16d | Transmitter terminal |
| 17a, 17b, 17c, 17d | Receiver terminal |
| 18a–18h | Connection pad |
| 19a–19k | Bonding wire |
| 20a, 20b | Piezpelectric substrate |
| 21a, 21b | Phase shift line |
| 22a–22d | Through hole |
| 23 | Branching filter |
| 24 | Substrate |
| 25a, 25b | Receiver coaxial filter |
| 26a, 26b | Transmitter coaxial filter |
| 27a, 27b | Single Pole Double Throw Switch |

What is claimed is:

1. A multi-frequency antenna duplexer comprising:
   a package, and
   a plurality of antenna duplexers, mounted in said package, having different passing bands from each other,
   wherein each of said plurality of antenna duplexers includes a transmitter surface acoustic wave (SAW)

filter and a receiver SAW filter having a passing band different from the passing band of the transmitter SAW filter, the transmitter SAW filter of said each of the plurality of antenna duplexers is formed on a first piezoelectric substrate, and the receiver SAW filter of said each of the plurality of antenna duplexers is formed on a second piezoelectric substrate, wherein in each of the receiver SAW filters, a phase shift substrate for rotating a phase of a transmission band of the each of said plurality of antenna duplexers including said each of the receiver SAW filters is incorporated between the first piezoelectric substrate and the second piezoelectric substrate in the package.

2. The multi-frequency antenna duplexer of claim 1, wherein at least first and second transmitter SAW filters are formed on the first piezoelectric substrate, at least first and second receiver SAW filters are formed on the second piezoelectric substrate, the first transmitter SAW filter and the first receiver SAW filter are disposed nearly adjacent to each other by way of the phase shift substrate, and the second transmitter SAW filter and the second receiver SAW filter are disposed nearly adjacent to each other by way of the phase shift substrate.

3. The multi-frequency antenna duplexer of claim 1, wherein the phase shift substrate is formed in an inner layer of the package.

4. An multi-frequency antenna duplexer comprising:

a package, and a plurality of antenna duplexers, mounted in said package, having different passing bands from each other, wherein each of said plurality of antenna duplexers includes a transmitter filter and a receiver filter having a passing band different from a passing band of the transmitter filter, one of the transmitter filter and the receiver filter is a bulk wave filter, and another of the transmitter filter and the receiver filter is a surface acoustic wave (SAW) filter or a further bulk filter.

5. The multi-frequency antenna duplexer of claim 4, further comprising:

a phase shift substrate for rotating a phase of a transmission band of one of the plurality of antenna duplexers.

6. The multi-frequency antenna duplexer of claim 5, wherein the phase shift substrate is formed in an inner layer of the package.

7. A multi-frequency antenna duplexer comprising:

a package, two antenna duplexers, mounted in said package having, different passing bands from each other, and a branching filter for coupling antenna terminals of the two antenna duplexers and one antenna terminal included in the package, wherein each of said two antenna duplexers includes a transmitter surface acoustic wave (SAW) filter and a receiver SAW filter having a passing band different from a passing band of the transmitter SAW filter, the transmitter SAW filter of each of the two antenna duplexers is formed on a first piezoelectric substrate, and the receiver SAW filter of each of the two antenna duplexers is formed on a second piezoelectric substrate.

8. The multi-frequency antenna duplexer of claim 7, wherein in each of the receiver SAW filters, a phase shift substrate for rotating a phase of a transmission band of the each of said two antenna duplexers including said each of the receiver SAW filter is incorporated between the first piezoelectric substrate and the second piezoelectric substrate in the package.

9. The multi-frequency antenna duplexer of claim 8, wherein at least first and second transmitter SAW filters are formed on the first piezoelectric substrate, at least first and second receiver SAW filters are formed on the second piezoelectric substrate, the first transmitter SAW filter and the first receiver SAW filter are disposed nearly adjacent to each other by way of the phase shift substrate, and the second transmitter SAW filter and the second receiver SAW filter are disposed nearly adjacent to each other by way of the phase shift substrate.

10. The multi-frequency antenna duplexer of claim 8, wherein the phase shift substrate and the branching filter are formed in an inner layer of the package.

11. A multi-frequency antenna duplexer comprising:

a package, two antenna duplexers, mounted in said package, having different passing bands, and a branching filter for coupling antenna terminals of the two antenna duplexers and one antenna terminal included in the package, wherein each of said two antenna duplexers includes a transmitter filter and a receiver filter having a passing band different from a passing band of the transmitter filter, one of the transmitter filter and the receiver filter is a bulk wave filter, and another of the transmitter filter and the receiver filter is a surface acoustic wave (SAW) filter or a further bulk filter.

12. The multi-frequency antenna duplexer of claim 11, further comprising:

a phase shift substrate for rotating a phase of a transmission band of one of the plurality of antenna duplexers.

13. The multi-frequency antenna duplexer of claim 12, wherein the phase shift substrate and the branching filter are formed in an inner layer of the package.

* * * * *